United States Patent
Arai

(10) Patent No.: US 8,378,488 B2
(45) Date of Patent: Feb. 19, 2013

(54) SEMICONDUCTOR DEVICE AND METHOD OF MANUFACTURING THE SAME

(75) Inventor: Shinya Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 554 days.

(21) Appl. No.: 12/512,265

(22) Filed: Jul. 30, 2009

(65) Prior Publication Data

US 2010/0038787 A1 Feb. 18, 2010

(30) Foreign Application Priority Data

Aug. 12, 2008 (JP) ................................. 2008-207821

(51) Int. Cl.
*H01L 23/532* (2006.01)

(52) U.S. Cl. .................. 257/751; 257/774; 257/E23.161

(58) Field of Classification Search .................. 257/774, 257/751, E23.161
See application file for complete search history.

(56) References Cited

U.S. PATENT DOCUMENTS

| 7,153,774 B2 | 12/2006 | Hau-Riege et al. |
| 7,396,759 B1 * | 7/2008 | van Schravendijk et al. . 438/625 |
| 2007/0080463 A1 | 4/2007 | Furuya |
| 2008/0057698 A1 | 3/2008 | Ishigami |

FOREIGN PATENT DOCUMENTS

| JP | 2005-129808 | 5/2005 |
| JP | 2006-253666 | 9/2006 |

\* cited by examiner

*Primary Examiner* — Roy Potter
(74) *Attorney, Agent, or Firm* — Finnegan, Henderson, Farabow, Garrett & Dunner, L.L.P.

(57) ABSTRACT

A semiconductor device has an interlayer insulating film that is formed on a semiconductor substrate and has a trench formed therein; a first diffusion barrier film formed on an inner surface of the trench; a Cu wiring layer buried in the trench with the first diffusion barrier film interposed between the Cu wiring layer and the inner surface of the trench; a second diffusion barrier film formed on top of the interlayer insulating film and the Cu wiring layer; an alloy layer primarily containing Cu formed at a first interface between the Cu wiring layer and the second diffusion barrier film; a first reaction layer that is formed at a second interface between the interlayer insulating film and the second diffusion barrier film; and a second reaction layer that is formed on the alloy layer and the first reaction layer.

4 Claims, 5 Drawing Sheets

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2008-207821, filed on Aug. 12, 2008, the entire contents of which are incorporated herein by reference.

BACKGROUND OF THE INVENTION

1. Field of the Invention

The present invention relates to a semiconductor device having a Cu wiring layer and a method of manufacturing the same.

2. Background Art

With the advance of miniaturization of wiring, Cu, which has a lower resistance, has become more popular as a material of wiring than Al.

And problems have arisen, such as deterioration of the electromigration (EM) resistance because of the miniaturization of wiring and deterioration of the time dependent dielectric breakdown (TDDB) between Cu wiring layers because of using a low dielectric constant film (in particular, a porous low-k film) as an interlayer insulating film.

For example, a conventional method of manufacturing a semiconductor device involves reducing Cu having reacted with oxygen by a plasma processing using a reducing gas ($NH_3$, for example) after planarizing a Cu wiring layer by CMP and before forming a diffusion barrier film (a SiCN film) on the Cu wiring layer. In this way, the EM resistance is improved.

However, according to the method of manufacturing a semiconductor device, a damaged layer is formed on the surface of the low dielectric constant film (in particular, the porous low-k film) because of the plasma processing. And a leak current may flow through the interface between the damaged layer and the diffusion barrier layer formed thereon, thus deteriorating the dielectric strength.

In order to improve the EM resistance, another conventional method of manufacturing a semiconductor device involves selectively depositing CoWP or CoWB on top of a Cu wiring layer (see Japanese Patent Laid-Open Nos. 2006-253666 and 2005-129808, for example). The CoWP or CoWB interposed between the Cu wiring layer and the interlayer insulating film formed thereon can improve the EM resistance.

However, according to the method of manufacturing a semiconductor device intended to improve the EM resistance, after the interlayer insulating film in which Cu wiring is formed, the CoWP or CoWB on the surface of the interlayer insulating film between the Cu wires is removed. However, some of the CoWP or CoWB remains on the surface of the interlayer insulating film between the Cu wires, and the residue may cause a short circuit between the wires.

As described above, the prior art has a problem that it is difficult to improve the withstand voltage of the interface (Cu/SiCN interface) between the Cu wiring layer and the diffusion barrier film and the interface between the low dielectric constant film and the diffusion barrier film (SiCN film).

SUMMARY OF THE INVENTION

According to one aspect of the present invention, there is provided: a semiconductor device, comprising:

an interlayer insulating film formed on a semiconductor substrate and having a trench formed therein;

a first diffusion barrier film formed on an inner surface of the trench;

a Cu wiring layer buried in the trench with the first diffusion barrier film interposed between the Cu wiring layer and the inner surface of the trench;

a second diffusion barrier film formed on top of the interlayer insulating film and the Cu wiring layer;

an alloy layer primarily containing Cu formed at a first interface between the Cu wiring layer and the second diffusion barrier film;

a first reaction layer that is formed at a second interface between the interlayer insulating film and the second diffusion barrier film as a result of reaction of an upper part of the interlayer insulating film with a same element as an element forming the alloy layer other than Cu; and a second reaction layer that is formed on the alloy layer and the first reaction layer as a result of reaction of a lower part of the second diffusion barrier film with the same element as the element forming the alloy layer other than Cu.

According to the other aspect of the present invention, there is provided: a method of manufacturing a semiconductor device to form a Cu wiring layer in an interlayer insulating film, comprising:

etching a interlayer insulating film to form a trench in the interlayer insulating film;

forming a first diffusion barrier film on an inner surface of the trench;

burying Cu in the trench with the first diffusion barrier film to form a Cu wiring layer;

removing an oxide of an upper surface of the Cu wiring layer by reduction by a plasma processing in which a reducing gas is plasma-activated;

forming a second diffusion barrier film on the Cu wiring layer and the interlayer insulating film;

ion-implanting an element to a first interface between the second diffusion barrier film and the Cu wiring layer and a second interface between the second diffusion barrier film and the interlayer insulating film; and heating a part around the first interface and a part around the second interface.

DETAILED DESCRIPTION

In the following, an embodiment of the present invention will be described with reference to the drawings.

[First Embodiment]

Figure 1:
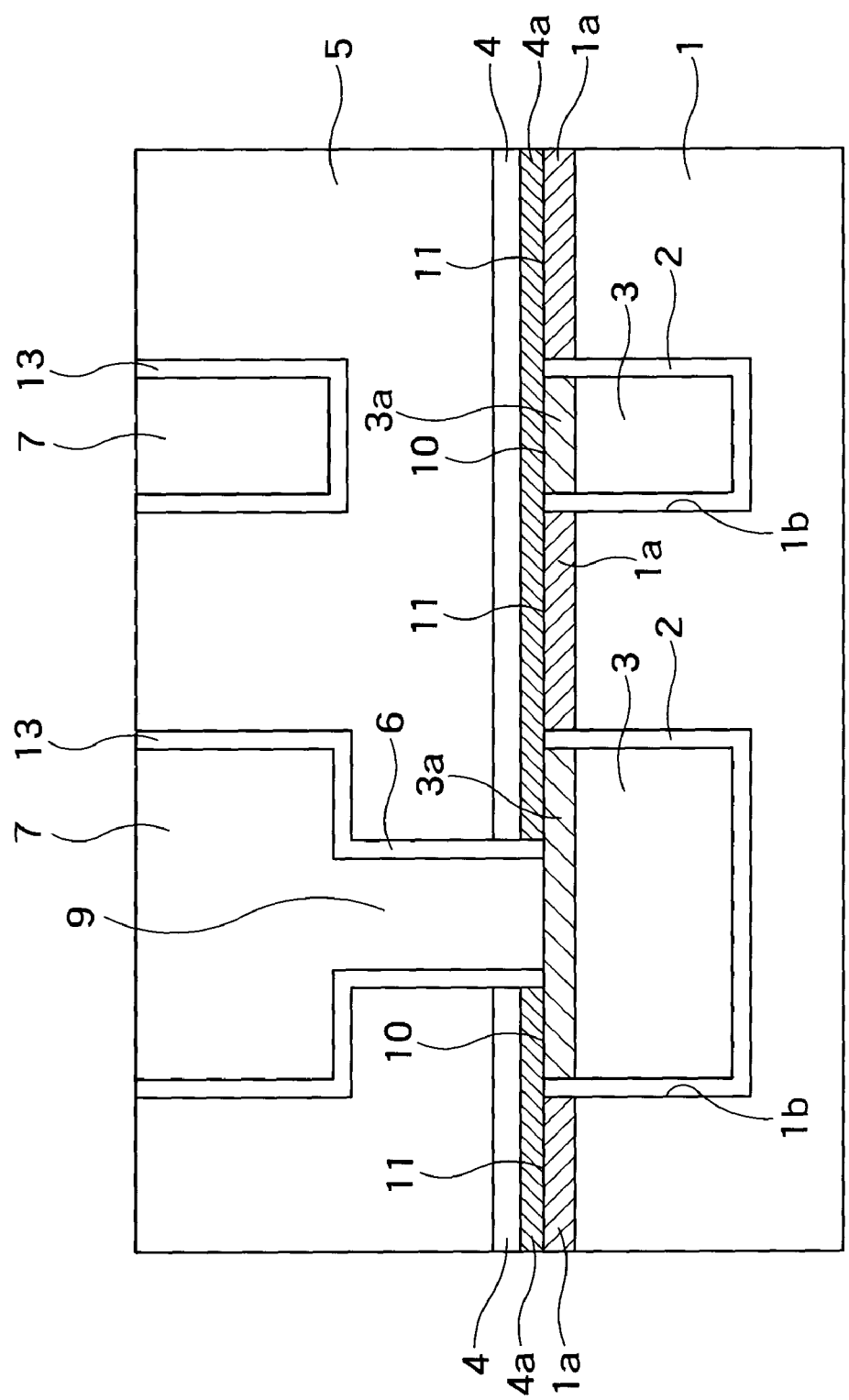
FIG. 1 is a cross-sectional view showing an exemplary configuration of a semiconductor device 100 according to a first embodiment of the present invention, which is an aspect of the present invention.

FIG. 1 is a cross-sectional view showing an exemplary configuration of a semiconductor device 100 according to a first embodiment of the present invention, which is an aspect of the present invention.

As shown in FIG. 1, the semiconductor device 100 has an interlayer insulating film 1, a first reaction layer 1a, a first diffusion barrier film 2, a Cu wiring layer 3, an alloy layer 3a, a second diffusion barrier film 4, a second reaction layer 4a, an interlayer insulating film 5, a third diffusion barrier film 6, a Cu wiring layer 7 and a via 9.

The interlayer insulating film 1 is formed on a semiconductor substrate (not shown) and has a trench 1b formed therein. The interlayer insulating film 1 is a low dielectric constant film (a porous low-k film, in particular) having a relative permittivity of 3 or less, for example. The interlayer insulating film 1 in this embodiment is a SiOC film, for example.

The first diffusion barrier film 2 is formed on the inner surface of the trench 1b. The first diffusion barrier film 2 serves as a film that prevent diffusion of Cu from the Cu wiring layer 3 into the interlayer insulating film 1. The first diffusion barrier film 2 is a Ta film or a TaN/Ta multilayer film, for example.

The Cu wiring layer 3 is buried in the trench 1b with the first diffusion barrier film 2 interposed between the Cu wiring layer 3 and the inner surface of the trench 1b. The Cu wiring layer 3 is electrically connected to an element or the like (not shown) formed on the semiconductor substrate.

The second diffusion barrier film 4 is formed on top of the interlayer insulating film 1 and the Cu wiring layer 3. The second diffusion barrier film 4 serves as a film that prevents diffusion of Cu from the Cu wiring layer 3 into the interlayer insulating film 5 constituted by a low dielectric constant film. The second diffusion barrier film 4 is an insulating film primarily containing SiN, SiON, SiCN or SiC, for example. The second diffusion barrier film 4 in this embodiment is a SiCN film.

The alloy layer 3a is formed at a first interface 10 between the Cu wiring layer 3 and the second diffusion barrier film 4. The alloy layer 3a primarily contains Cu and, in addition to Cu, contains at least one element selected from among Mn, Al, Mg, Ni, Co, W, Si and C. The alloy layer 3a in this embodiment is made of an alloy of Cu and Mn.

The first reaction layer 1a is formed at a second interface 11 between the interlayer insulating film 1 and the second diffusion barrier film 4. The first reaction layer 1a in this embodiment is a SiOC—Mn reaction layer formed as a result of reaction of an upper part of the interlayer insulating film 1 with the same element (Mn) as the element forming the alloy layer 3a other than Cu.

The second reaction layer 4a is formed at least on the first interface 10 and the second interface 11 (that is, on the alloy layer 3a and the first reaction layer 1a). The second reaction layer 4a in this embodiment is a SiCN—Mn reaction layer formed as a result of reaction of a lower part of the second diffusion barrier film 4 with the same element (Mn) as the element forming the alloy layer other than Cu.

The Cu wiring layer 7 is formed in the interlayer insulating film 5 formed on the second diffusion barrier film 4. The Cu wiring layer 7 is electrically connected to the Cu wiring layer 3 via the via 9 made of Cu and the alloy layer 3a.

Note that the third diffusion barrier film 6 is formed between the Cu wiring layer 7 and via 9 and the interlayer insulating film 5. The third diffusion barrier film 6 serves as a film that prevents diffusion of Cu from the Cu wiring layer 7 and the via 9 into the interlayer insulating film 5.

The same structure as that composed of the alloy layer 3a, the first reaction layer 1a, the second reaction layer 4a and the second diffusion barrier layer 4 (not shown) is formed also on the interlayer insulating film 5 and the Cu wiring layer 7.

Next, a method of manufacturing the semiconductor device 100 configured as described above, that is, an exemplary method of forming a Cu wiring layer in an interlayer insulating film will be described.

FIGS. 2A to 3C are cross-sectional views showing different steps in a method of manufacturing a semiconductor device according to the first embodiment.

Figure 2A:
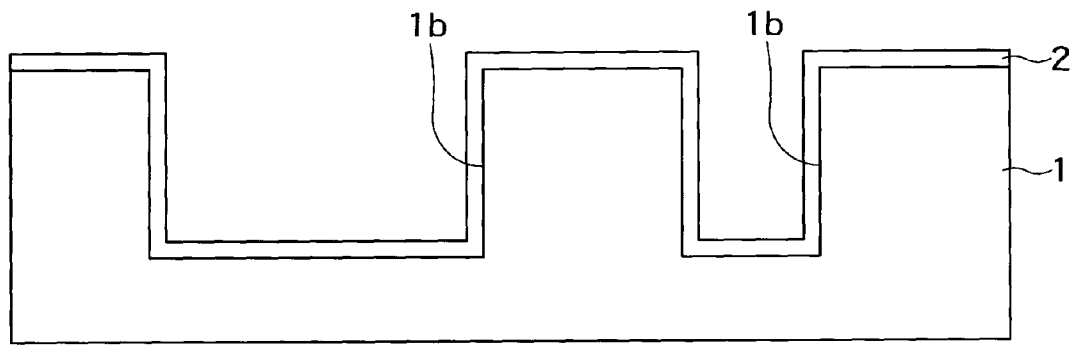
FIG. 2A is a cross-sectional view showing a step in a method of manufacturing a semiconductor device according to the first embodiment.

First, an interlayer insulating film 1 formed on a semiconductor substrate (not shown) is etched to form a trench 1b in a region of the interlayer insulating film 1 in which a Cu wiring layer 3 is to be formed. Then, a first diffusion barrier film 2 to prevent diffusion of Cu into the interlayer insulating film 1 is formed by plasma enhanced chemical vapor deposition (PECVD), for example, on the inner surface of the trench 1b and on the interlayer insulating film 1 (FIG. 2A).

Note that the interlayer insulating film 1 is a low dielectric constant film (in particular, a porous low-k film) as described above. More specifically, the interlayer insulating film 1 is a SiOC film, for example.

Furthermore, the first diffusion barrier film 2 is a Ta film or a TaN/Ta multilayer film, for example, as described above.

Then, a seed layer (not shown) is formed on the surface of the first diffusion barrier film 2, and Cu as a conductive material is deposited on the surface of the seed layer by electroplating, for example. In this step, Cu as the conductive material is buried in the trench with the first diffusion barrier film 2 formed on the inner surface thereof to form a Cu wiring layer 3.

Figure 2B:
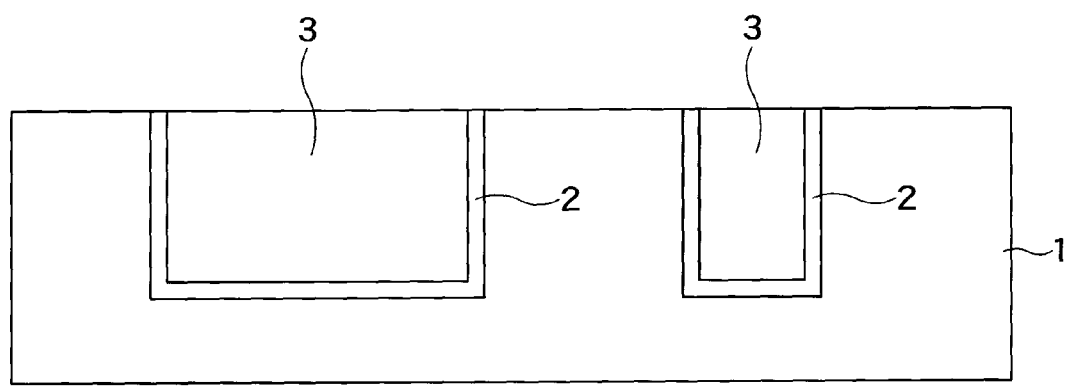
FIG. 2B is a cross-sectional view showing a step in a method of manufacturing a semiconductor device according to the first embodiment, is continuous from FIG. 2A.

In addition, the Cu wiring layer 3 and the first diffusion barrier film 2 are polished and planarized by CMP, for example, to expose the upper surface of the interlayer insulating film 1 (FIG. 2B).

Then, an oxide ($CuO_x$, for example) on the upper surface of the Cu wiring layer 3 is removed by reduction by a plasma processing in which a reducing gas is plasma-activated. In this step, a surface part of the interlayer insulating film 1 is made metastable by the plasma processing. For example, in the case where the interlayer insulating film 1 is a SiOC film, the surface part of the SiOC film is made metastable because of breakage of the methyl group.

Figure 2C:
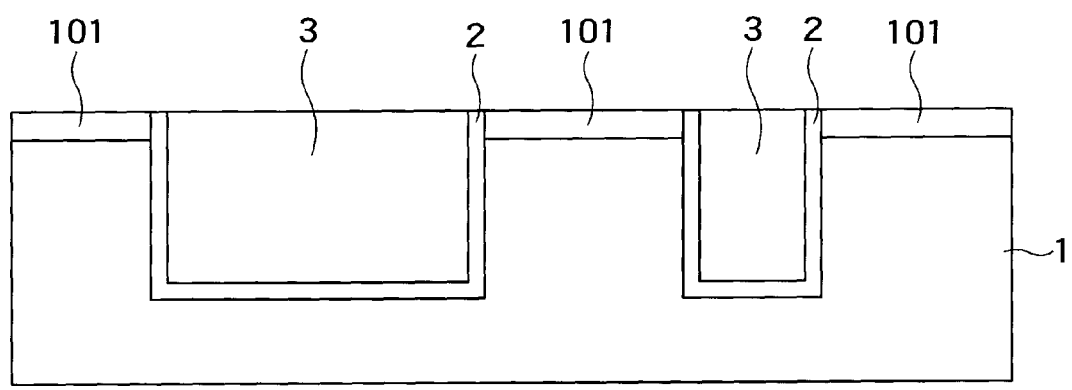
FIG. 2C is a cross-sectional view showing a step in a method of manufacturing a semiconductor device according to the first embodiment, is continuous from FIG. 2B.

That is, as a result of the plasma processing, a damaged layer 101 is formed in the upper surface part of the interlayer insulating film 1 (FIG. 2C).

Note that the reducing gas contains $H_2$ or $NH_3$, for example.

Figure 3A:
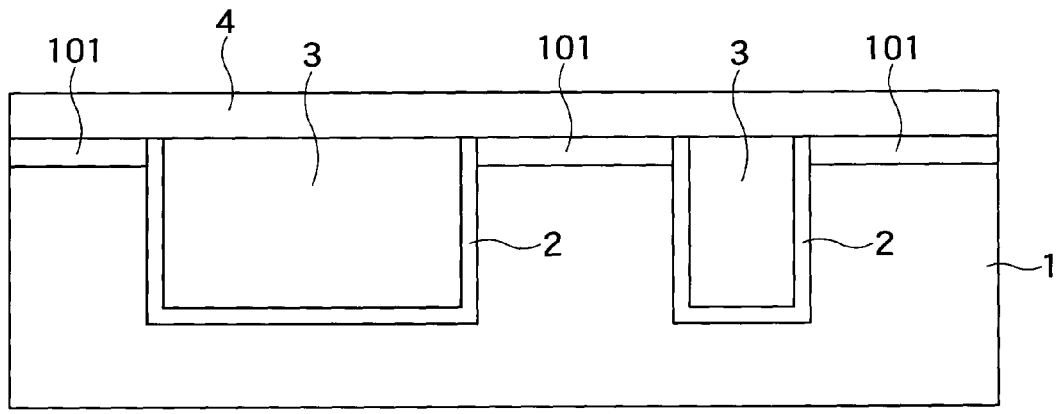
FIG. 3A is a cross-sectional view showing a step in a method of manufacturing a semiconductor device according to the first embodiment, is continuous from FIG. 2C.

Then, a second diffusion barrier film 4 is formed on the Cu wiring layer 3 and the interlayer insulating film 1 by PECVD (FIG. 3A).

Note that the second diffusion barrier film 4 is an insulating film primarily containing SiN, SiON, SiCN or SiC, for example.

Figure 3B:
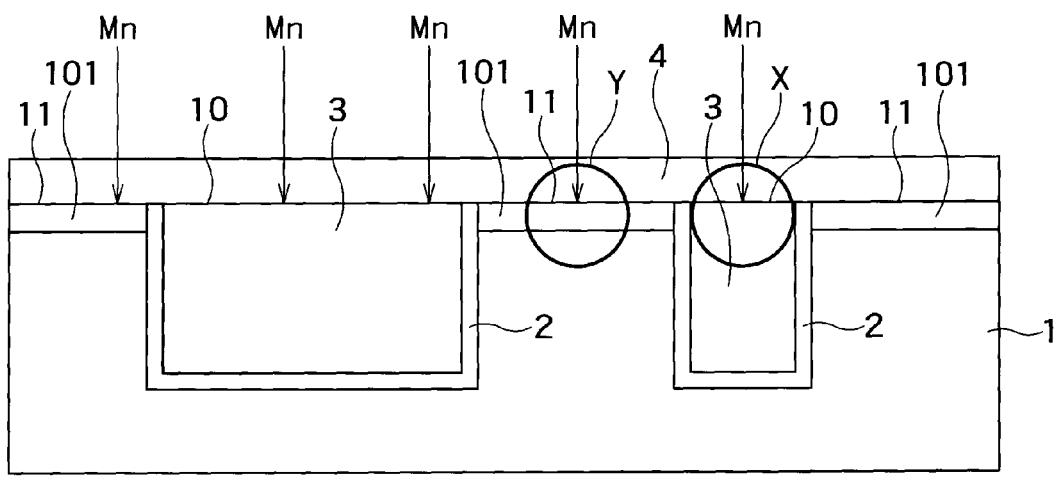
FIG. 3B is a cross-sectional view showing a step in a method of manufacturing a semiconductor device according to the first embodiment, is continuous from FIG. 3A.

Then, an element (Mn, in this embodiment) is implanted by ion implantation through the second diffusion barrier film 4 to the depth of the first interface 10 between the second diffusion barrier film 4 and the Cu wiring layer 3 and the second interface 11 between the second diffusion barrier film 4 and the interlayer insulating film 1 (FIG. 3B).

Note that the ion implantation is performed under the conditions that the acceleration energy is 1 to 100 kev, and the amount of ion implanted is $1\times10^{14}/cm^2$ to $1\times10^{17}/cm^2$.

Instead of Mn, the element may be at least one of Al, Mg, Ni, Co, W, Si and C, for example.

Figure 4A:
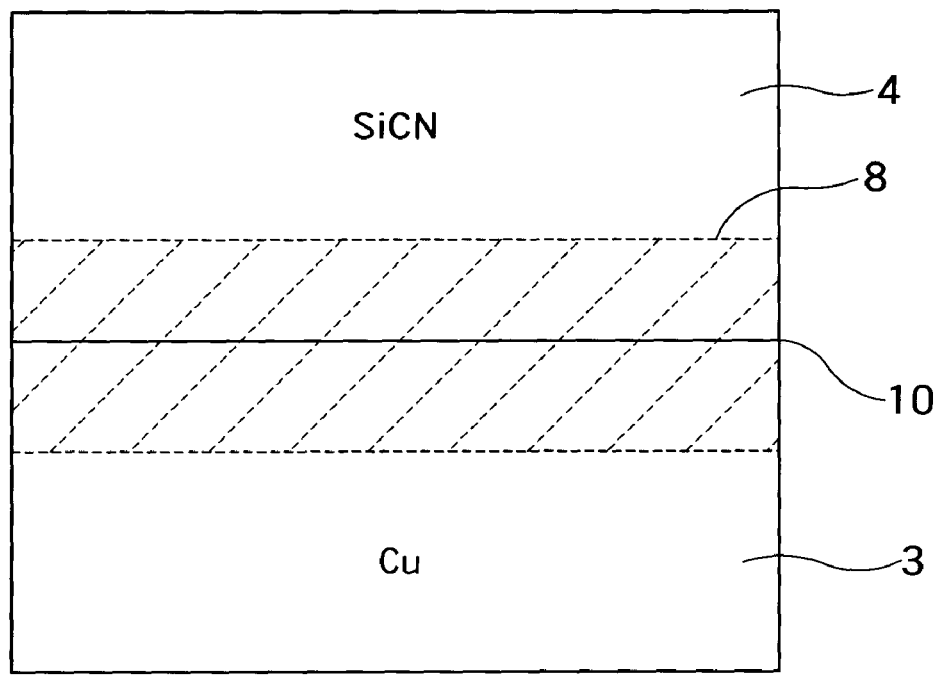
FIG. 4A is an enlarged cross-sectional view of a region X including the first interface 10 shown in FIG. 3B.
Figure 4B:
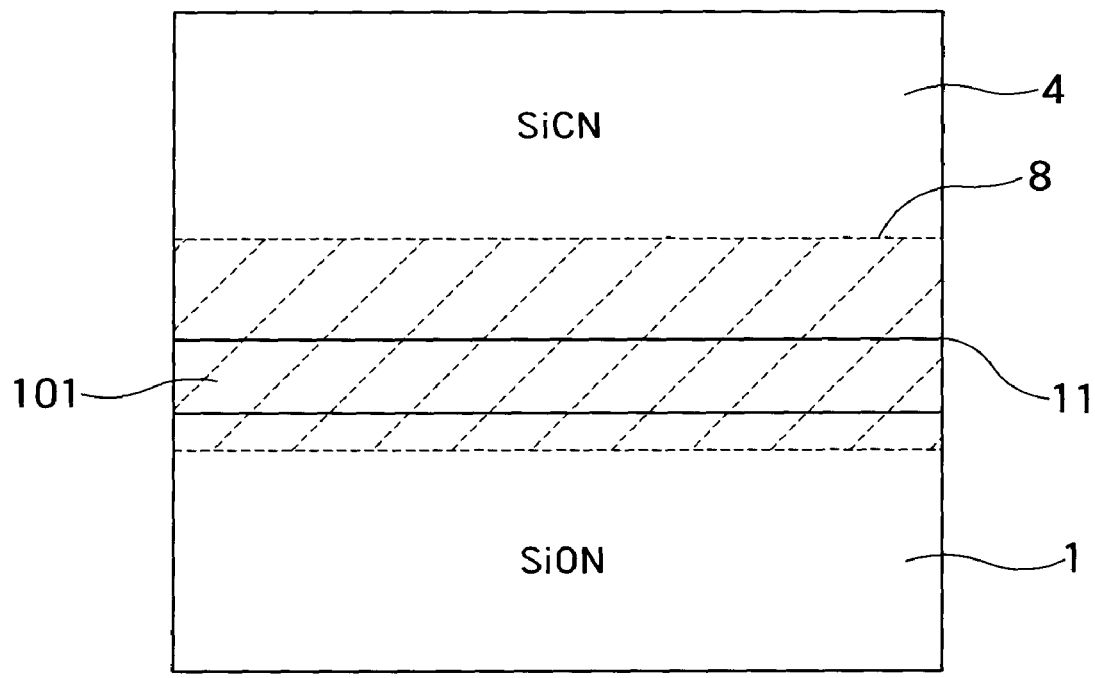
FIG. 4B is a cross-sectional view of a region Y including the second interface 11 shown in FIG. 3B.

FIG. 4A is an enlarged cross-sectional view of a region X including the first interface 10 shown in FIG. 3B. FIG. 4B is a cross-sectional view of a region Y including the second interface 11 shown in FIG. 3B.

As described above, an ion implantation layer 8 is formed in the vicinity of the first interface 10 as a result of the Mn ion implantation (FIG. 4A). As a result, bonds of Cu atoms and constituent atoms of SiCN are broken, and mixing occurs in the Cu/SiCN interface.

In addition, as described above, an ion implantation layer 8 is formed also in the vicinity of the second interface 11 as a result of the Mn ion implantation (FIG. 4B). As a result, mixing occurs also in the second interface 11 between damaged layer 101 and the interlayer insulating film (SiCN film) 4.

Figure 3C:
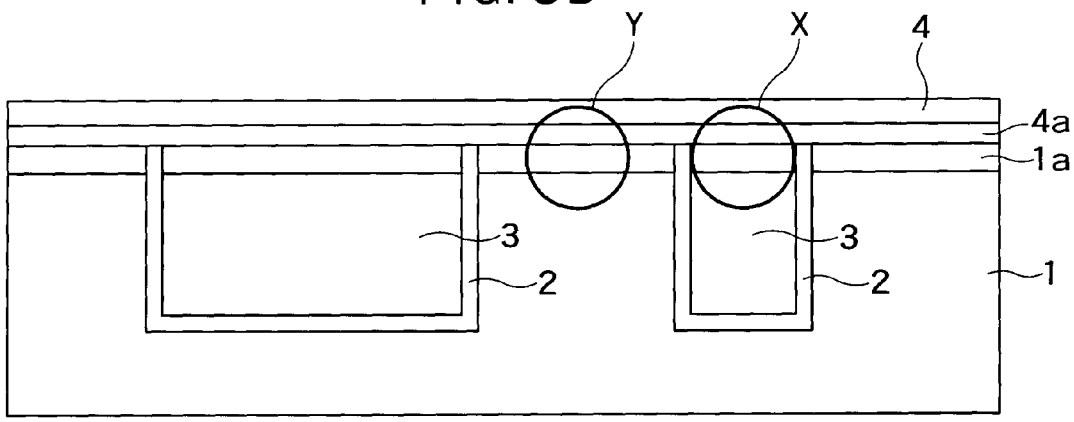
FIG. 3C is a cross-sectional view showing a step in a method of manufacturing a semiconductor device according to the first embodiment, is continuous from FIG. 3B.
Figure 5A:
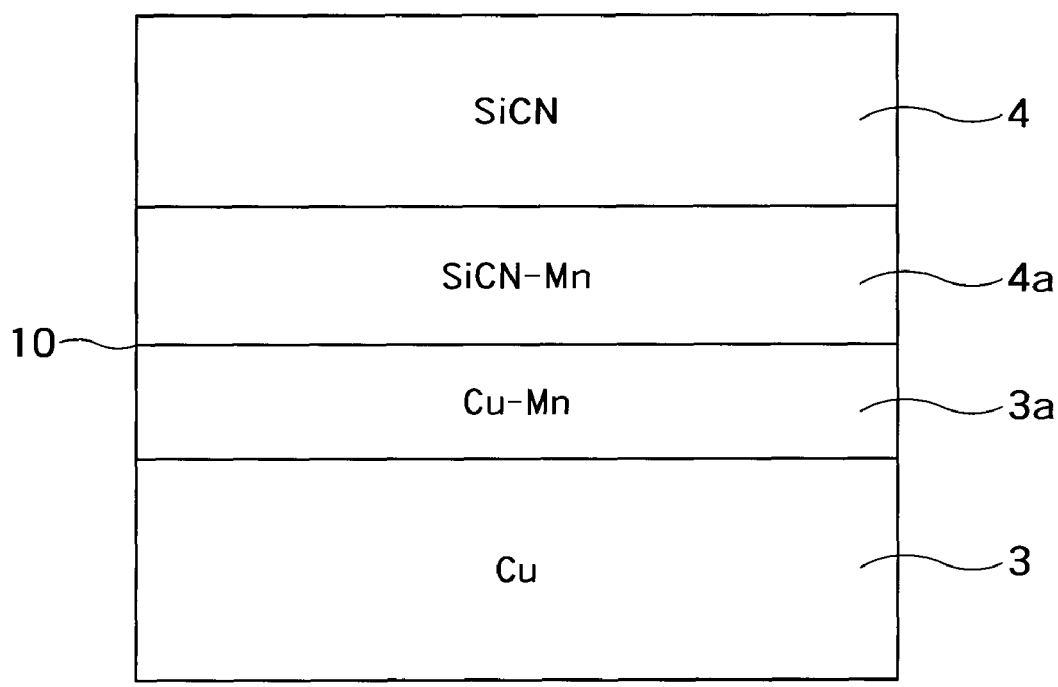
FIG. 5A is an enlarged cross-sectional view of the region X including the first interface 10 shown in FIG. 3C.
Figure 5B:
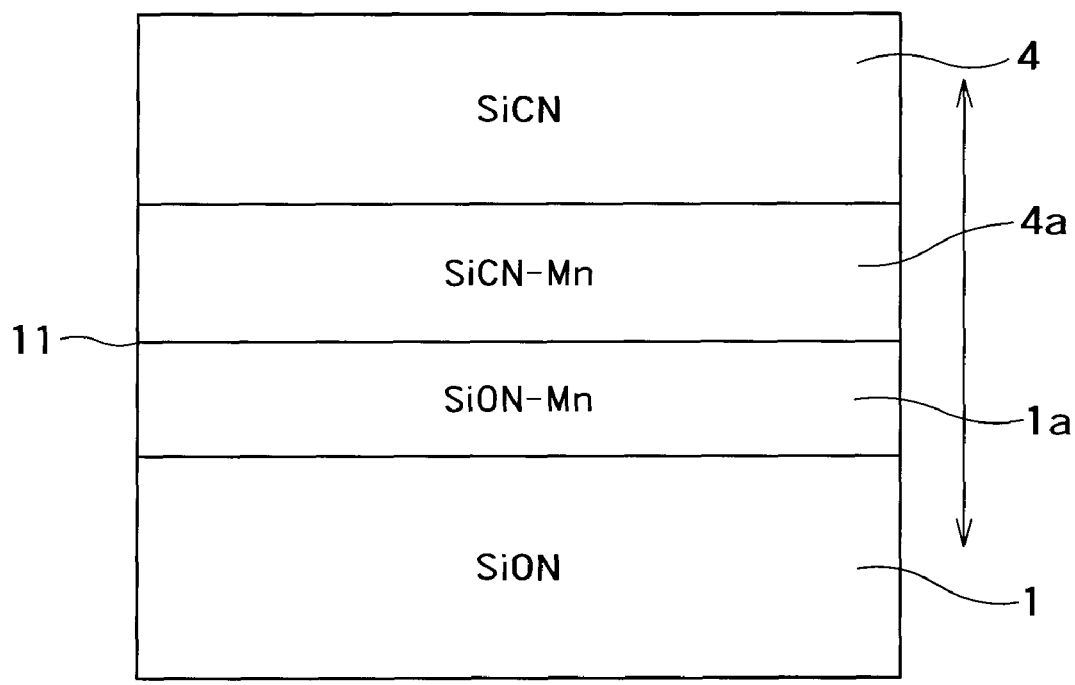
FIG. 5B is an enlarged cross-sectional view of the region Y including the second interface 11 shown in FIG. 3C.

FIG. 5A is an enlarged cross-sectional view of the region X including the first interface 10 shown in FIG. 3C. FIG. 5B is an enlarged cross-sectional view of the region Y including the second interface 11 shown in FIG. 3C.

After the ion implantation, a part around the first interface and a part around the second interface are heated (at 250 degrees C. for 60 minutes, for example).

As a result, at the first interface 10, an alloy layer 3a of Cu and Mn is formed in the Cu wiring layer 3, and a second reaction layer 4a of SiCN and Mn is formed in the second diffusion barrier layer 4 (FIGS. 3C and 5A).

In addition, at the second interface 11, a first reaction layer 1a of SiOC and Mn is formed in the interlayer insulating film 1, and a second reaction layer 4a of SiCN and Mn is formed in the second diffusion barrier layer 4 (FIGS. 3C and 5B).

The alloy of Cu and Mn has a higher EM resistance than pure Cu. Thus, the alloy layer 3a is formed at the first interface 10 between the Cu wiring layer 3 and the second diffusion barrier film 4, at which Cu migration is most likely to occur, to improve the EM resistance as described above.

In addition, broken bonds in the damaged layer 101 and the second diffusion barrier film 4 are combined with Mn by the heating process. As a result, the dielectric strength at the second interface 11 is improved. Furthermore, the discontinuous interface between different materials is eliminated in the vicinity of the second interface 11, so that the interface leak at the second interface 11 is suppressed.

Note that the heating process does not need to be performed as a separate step. For example, only performing a heating process to form a diffusion layer or to form an interlayer insulating film will suffice. In other words, the heating process does not need to be performed immediately after the ion implantation and may be performed during or after the formation of multiple wiring layers described later.

Then, an interlayer insulating film 5 is formed on the second diffusion barrier film 4 by PECVD, for example. Then, a trench contact hole is formed in the interlayer insulating film 5, a third diffusion barrier film 6 is formed, and then, a Cu wiring layer 7 and a via 9 are formed by a dual damascene process, for example. In this way, the structure of the semiconductor device 100 shown in FIG. 1 is provided.

As required, the process described above can be appropriately repeated to form multiple wiring layers.

The process described above can improve the EM resistance by forming the alloy layer at the interface between the Cu wiring layer and the second diffusion barrier film and can improve the TDDB resistance by modifying the characteristics of the damaged layer formed in the interlayer insulating film in forming the second diffusion barrier film.

As described above, the semiconductor device according to this embodiment has an improved dielectric strength, and the method of manufacturing the semiconductor device according to this embodiment improves the dielectric strength thereof.

What is claimed is:

1. A semiconductor device, comprising:
   an interlayer insulating film formed on a semiconductor substrate and having a trench formed therein;
   a first diffusion barrier film formed on an inner surface of the trench;
   a Cu wiring layer buried in the trench with the first diffusion barrier film interposed between the Cu wiring layer and the inner surface of the trench;
   a second diffusion barrier film formed on top of the interlayer insulating film and the Cu wiring layer;
   an alloy layer primarily containing Cu formed at a first interface between the Cu wiring layer and the second diffusion barrier film;
   a first reaction layer that is formed at a second interface between the interlayer insulating film and the second diffusion barrier film as a result of reaction of an upper part of the interlayer insulating film with a same element as an element forming the alloy layer other than Cu; and
   a second reaction layer that is formed on the alloy layer and the first reaction layer as a result of reaction of a lower part of the second diffusion barrier film with the same element as the element forming the alloy layer other than Cu,
   wherein the element forming the alloy layer other than Cu is any one of Mn, Al, Mg Ni Co W, Si and C.

2. The semiconductor device of claim 1, wherein the second diffusion barrier film is an insulating film primarily containing SiN, SiON, SiCN or SiC.

3. The semiconductor device of claim 1, wherein the interlayer insulating film is a low dielectric constant film having a relative permittivity of 3.0 or less.

4. The semiconductor device of claim 3, wherein the interlayer insulating film is a SiOC film.

* * * * *